United States Patent
Dray et al.

(10) Patent No.: US 9,478,273 B2
(45) Date of Patent: Oct. 25, 2016

(54) LOW RESISTANCE BITLINE AND SOURCELINE APPARATUS FOR IMPROVING READ AND WRITE OPERATIONS OF A NONVOLATILE MEMORY

(71) Applicants: Cyrille Dray, Hillsboro, OR (US); Blake C. Lin, Portland, OR (US); Fatih Hamzaoglu, Portland, OR (US); Liqiong Wei, Portland, OR (US); Yih Wang, Portland, OR (US)

(72) Inventors: Cyrille Dray, Hillsboro, OR (US); Blake C. Lin, Portland, OR (US); Fatih Hamzaoglu, Portland, OR (US); Liqiong Wei, Portland, OR (US); Yih Wang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/129,506

(22) PCT Filed: Oct. 31, 2013

(86) PCT No.: PCT/US2013/067892
§ 371 (c)(1),
(2) Date: Dec. 26, 2013

(87) PCT Pub. No.: WO2015/065462
PCT Pub. Date: May 7, 2015

(65) Prior Publication Data
US 2015/0117095 A1    Apr. 30, 2015

(51) Int. Cl.
*G11C 11/16* (2006.01)

(52) U.S. Cl.
CPC .................. *G11C 11/1675* (2013.01)

(58) Field of Classification Search
CPC .................................. G11C 11/1675
USPC .......... 365/158, 21.3, 49.15, 55, 57
See application file for complete search history.

(56) References Cited

U.S. PATENT DOCUMENTS

| 5,291,440 A | 3/1994 | Koyama |
| 5,587,946 A | 12/1996 | Campardo et al. |

(Continued)

FOREIGN PATENT DOCUMENTS

| EP | 2455942 A2 | 5/2012 |
| WO | WO-2012019135 A2 | 2/2012 |

OTHER PUBLICATIONS

International Search Report and the Written Opinion of the International Searching Authority for International Application No. PCT/US2013/067892, mailed Aug. 28, 2014, 6 pages.

(Continued)

*Primary Examiner* — Vu Le
*Assistant Examiner* — Sung Cho
(74) *Attorney, Agent, or Firm* — Blakely, Sokoloff, Taylor & Zafman LLP

(57) ABSTRACT

Described is an apparatus for improving read and write margins. The apparatus comprises: a sourceline; a first bitline; a column of resistive memory cells, each resistive memory cell of the column coupled at one end to the sourceline and coupled to the first bitline at another end; and a second bitline in parallel to the first bitline, the second bitline to decouple read and write operations on the bitline for the resistive memory cell. Described is also an apparatus which comprises: a sourceline; a bitline; a column of resistive memory cells, each resistive memory cell in the column coupled at one end to the sourceline and coupled to the bitline at another end; and sourceline write drivers coupled to the bitline and the sourceline, wherein the sourceline write drivers are distributed along the column of resistive memory cells.

19 Claims, 9 Drawing Sheets

(56) References Cited

U.S. PATENT DOCUMENTS

| | | | |
|---|---|---|---|
| 6,335,890 B1* | 1/2002 | Reohr | G11C 11/16 365/225.5 |
| 6,498,747 B1* | 12/2002 | Gogl | G11C 11/15 365/158 |
| 7,403,413 B2* | 7/2008 | Liaw | G11C 8/16 365/148 |
| 7,626,871 B1* | 12/2009 | Yang | G11C 7/22 365/154 |
| 2004/0188714 A1* | 9/2004 | Scheuerlein | G11C 7/18 257/200 |
| 2004/0264239 A1* | 12/2004 | Tsang | G11C 11/16 365/158 |
| 2007/0146013 A1* | 6/2007 | Hsu | G01R 31/3008 326/112 |
| 2008/0298124 A1 | 12/2008 | Wong | |
| 2009/0108383 A1 | 4/2009 | Horng et al. | |
| 2009/0161422 A1* | 6/2009 | Zhu | G11C 11/16 365/171 |
| 2009/0262571 A1* | 10/2009 | Sakimura | G11C 11/16 365/158 |
| 2010/0118593 A1* | 5/2010 | Cho | H01L 45/148 365/148 |
| 2010/0214845 A1 | 8/2010 | Choi | |
| 2010/0271893 A1 | 10/2010 | Lee | |
| 2010/0309731 A1* | 12/2010 | Hess | G11C 8/12 365/189.02 |
| 2011/0249490 A1 | 10/2011 | Zhu et al. | |
| 2011/0280057 A1* | 11/2011 | Kim | G11C 29/02 365/148 |
| 2011/0305067 A1 | 12/2011 | Ueda | |
| 2012/0014174 A1 | 1/2012 | Rao et al. | |
| 2013/0028010 A1* | 1/2013 | Li et al. | 365/158 |
| 2014/0092665 A1* | 4/2014 | Ueda | G11C 13/0002 365/63 |
| 2015/0070982 A1* | 3/2015 | Miyakawa | G11C 11/161 365/158 |

OTHER PUBLICATIONS

International Search Report and the Written Opinion of the International Searching Authority for International Application No. PCT/US2013/062421, mailed Jun. 23, 2014, 10 pages.

Taiwan Office Action and Search Report for Application No. 103132262, mailed Oct. 23, 2015, with translation, 15 pgs.

Hun-Chang Yu et al., "Cycling endurance optimization scheme fir 1Mb STT-MRAM in 40nm technology", Solid-State Circuits Conference Digest of Technical Papers (ISSCC), 2013 IEEE International_TSMC, IEEE 2013 ISCC: Session 12, Non-Volatile Memory Solutions, 12.8, Date of conference: Feb. 17-21, 2013 Location: San Francisco, CA ISSN: 0193-6530 Print ISBN: 978-1-4673-4515-6 DOI: 10.1109/ISSCC.2013.6487710, pp. 224-225.

Riichiro Takemura et al. , "A 32-Mb SPRAM With 2T1R Memory Cell, Localized Bi-Directional Write Driver and '1'/'0' Dual-Array Equalized Reference Scheme" IEEE Solid-State Circuits Society IEE Journal of Solid-State Circuits, vol. 45, No. 4, Apr. 2010, ISSN: 0018/9200 INSPEC: 11204149 DOI: 10.1109/JSSC.2010.2040120, pp. 869-879.

* cited by examiner

LOW RESISTANCE BITLINE AND SOURCELINE APPARATUS FOR IMPROVING READ AND WRITE OPERATIONS OF A NONVOLATILE MEMORY

CLAIM OF PRIORITY

This application claims the benefit of priority of International Patent Application No. PCT/US2013/067892 filed Oct. 31, 2013, titled "LOW RESISTANCE BITLINE AND SOURCELINE APPARATUS FOR IMPROVING READ AND WRITE OPERATIONS OF A NONVOLATILE MEMORY," which is incorporated by reference in its entirety.

BACKGROUND

On chip embedded MRAM (magnetic random access memory) with non-volatility can enable energy and computational efficiency with memory density exceeding high density SRAM (static random access memory). However, leading STT-MRAM (Spin-Torque Transfer Magnetic Random Access Memory) integrated with advanced CMOS (e.g., 14 nm and smaller CMOS process technology nodes) suffer from high voltage and high current-density problems during the programming (i.e., writing operation) of a bit-cell.

For example, STT-MRAM integrated with advanced CMOS process technology exhibits insufficient drive current which is caused by intrinsic high resistance of the MRAM device during a write operation from anti-parallel to parallel state. STT-MRAM integrated with advanced CMOS process technology also exhibits high write error rates and/or low speed switching (e.g., exceeding 20 ns) in MTJ based MRAM due to the insufficient drive current. STT-MRAM integrated with advanced CMOS process technology also exhibits reliability issues due to overdriving of bits near the write driving circuitry. These and other problems are expected to grow as CMOS process scales to lower metal pitches (e.g., Metal-0 pitches).

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
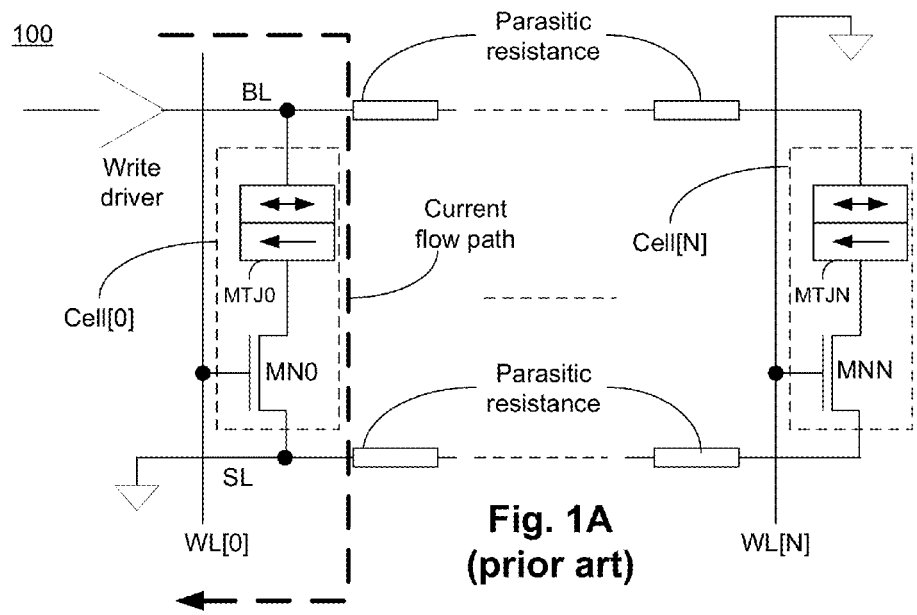
FIGS. 1A-B illustrate columns of an MRAM (magnetic random access memory) array which produce high stress on the bit-cells nearer to the driving end and high write error rate for the bit-cells farther from the driving end.
Figure 1B:
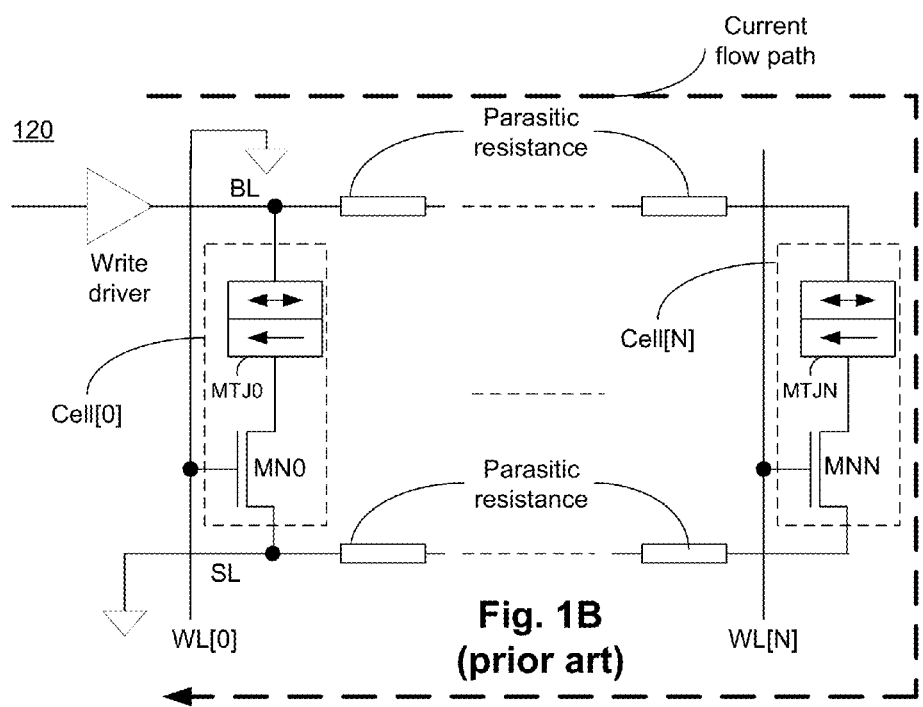

FIGS. 1A-B illustrate columns of an MRAM (Magnetic Random Access Memory) array which produce high stress on the bits nearer to the driving end and high write error rate for the bits farther from the driving end. FIG. 1A illustrates a column 100 of an MRAM array having a write driver to drive BitLine (BL) signal path for a plurality of MTJ (Magnetic Tunnel Junction) based bit-cells i.e., Cell[0] to Cell[N], where 'N' is an integer greater than 1. Each bit-cell includes an MTJ device with its free ferromagnetic layer (i.e., layer with bi-directional arrow) coupled to BL, the fixed ferromagnetic layer (i.e., layer with unidirectional arrow) coupled to a transistor e.g., n-type transistor (also called select transistor), and gate terminal of the transistor coupled to a word-line (WL).

For example, Cell[0] has MTJ0 device coupled in series with n-type transistor MN0 such that the drain terminal of MN0 is coupled to the fixed ferromagnetic layer, source terminal of MN0 is coupled to select-line or SourceLine (SL) signal path, and gate terminal is coupled to word-line WL[0]. Likewise, Cell[N] has MTJN device coupled in series with n-type transistor MNN such that the drain terminal of MNN is coupled to the fixed ferromagnetic layer, source terminal of MNN is coupled to SL signal path, and gate terminal is coupled to word-line WL[N].

The read and write current paths for each bit-cell are identical, resulting in many design trade-offs. For example, during read operation, a higher resistance of MTJ device is desired than during write operation. However, having the same current paths for passing read and write currents discourages from having different resistances for read and write operations. To write a logical high to a bit-cell, SL is raised relative to BL, and to write a logical low to a bit-cell, SL is lowered relative to the BL. To read from a bit-cell, SL is set to logical low and MTJ device resistance is sensed using weak current (e.g., $\frac{1}{8}^{th}$ of write current). All bit-cells in the same column share the same BL and SL. In FIG. 1A, WL[0] is selected and WL for the other bit-cells is set to logical low i.e., ground. The resulting current path is shown by the dotted arrow path which produces high stress on Cell[0].

The bit-cells may have large write current (e.g., greater than 100 μA) and large voltage (e.g., greater than 0.7V) requirements of MTJ devices. The bit-cells may have high write error rates and/or low speed switching (e.g., exceeding 20 ns) in MTJ based MRAM. The bit-cells may also have reliability issues due to tunneling current in MTJs. For example, insulator layer in the MTJ device is a barrier (e.g., 1KΩ to 10KΩ) which resists flow of large current, and lower current flow causes higher write errors.

FIG. 1B illustrates a column 120 of the MRAM array in which the last Cell[N] is selected by WL[N]. In this example, WL[N] is logical high while WLs for other bit-cells is logical low. To avoid write errors on Cell[N], the write driver has to drive a large current to compensate for the IR (current*resistance) drop caused by parasitic resistances on both BL and SL signal paths. The current path is shown by the dotted bold line. In this example, high current is used to reduce write errors for bit-cells farther from the driving side. However, bit-cells near to the driving side experience high stress because of the high current used to reduce write errors.

As CMOS process nodes shrink, and higher memory densities are desired, MRAMs are formed using more of the lower metal layers in the process. Lower metal layers provide smaller pitches than higher metal layers, and thus allow for more compact MRAMs. However, lower metal layers have high IR (i.e., current times resistance) drop. Higher IR drop causes high write error rates and/or low speed switching for low drive current. To improve write error rates and to speed up the switching process, high drive current can be used, but such current may cause reliability issues due to overdriving of bit-cells near the write driving circuitry.

The embodiments, allow improving the drive current to the MTJ device based bit-cells without causing high stress to the MTJ device based bit-cells while lowering write error rate. The above technical effects are non-limiting technical effects. Other technical effects can be derived from the embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more major constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and the include plural references. The meaning of "in" includes "in" and "on".

The term "scaling" generally refers to converting a design (schematic and layout) from one process technology to another more advanced process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFet transistors, Gate All Around Cylindrical Transistors or other devices implementing transistor functionality like carbon nano tubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Figure 2:
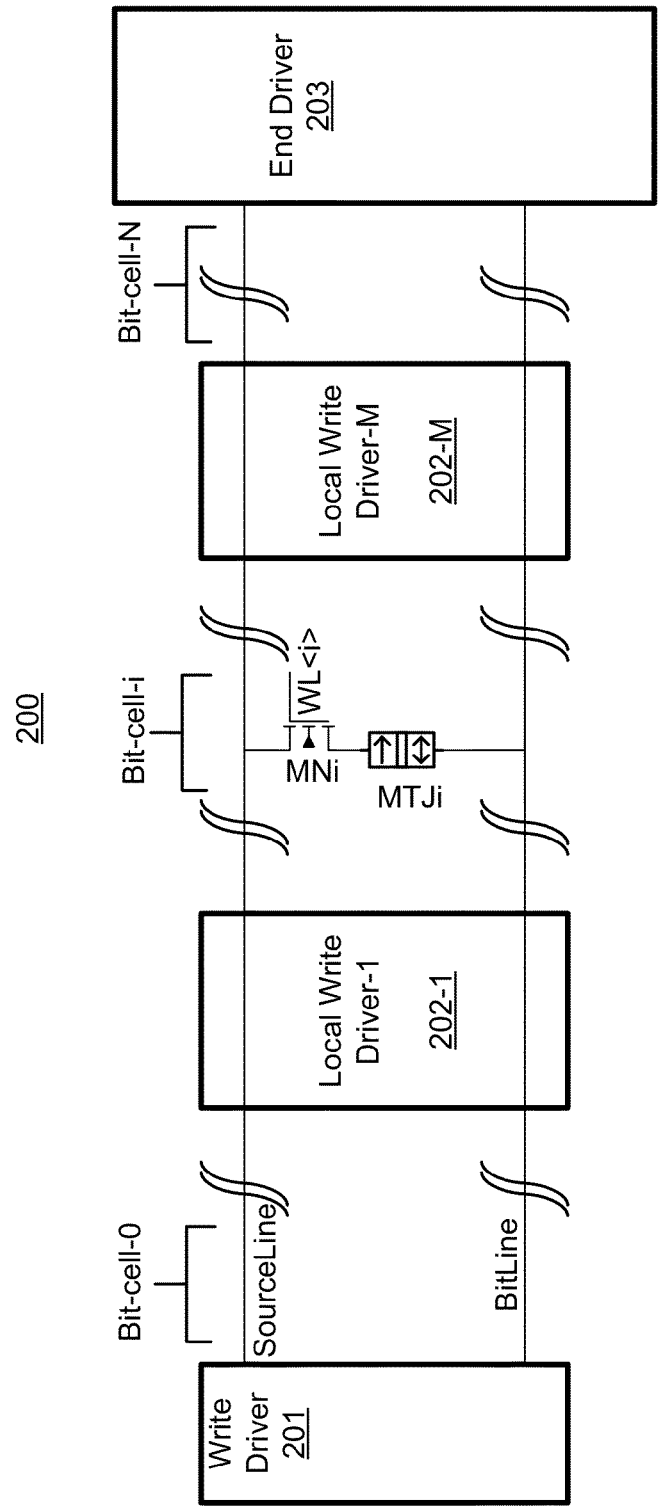
FIG. 2 illustrates a column of a memory array with resistive memory cells and with embedded write drivers, according to one embodiment of the disclosure.

FIG. 2 illustrates a column 200 of a memory array with resistive memory cells and with embedded write drivers, according to one embodiment of the disclosure. In one embodiment, column 200 comprises Write Driver 201, plurality of memory bit-cells (e.g., Bit-cell-0 to Bit-cell-N, where 'N' is an integer and 'i' is an integer smaller than 'N'), Local Write Drivers (e.g., 202-1 to 202-M, where 'M' is an integer) distributed within column 200, and End Driver 203.

In one embodiment, Write Driver 201 comprises a first driver to drive BL and a second driver to drive the SL. In one embodiment, the first driver comprises a p-type transistor coupled to the BL such that its drain terminal is coupled to the BL, its source terminal is coupled to power supply (Vcc), and its gate terminal is controllable by a write control signal. In one embodiment, the write control signal is a Write '0' active low control signal. In one embodiment, the second driver comprises a p-type transistor coupled to the SL such that its drain terminal is coupled to the SL, its source terminal is coupled to power supply (Vcc), and its gate terminal is controllable by a write control signal. In one embodiment, the write control signal is a Write '1' active low control signal. In other embodiments, other types of write drivers may be used that are controllable by appropriate write control signals used for writing a zero (i.e., logical low) or a one (i.e., logical high).

In one embodiment, the resistive memory cells include a resistive element which is one of: MTJ device; phase change memory (PCM) device; resistive RAM (ReRAM); conductive bridging RAM (CBRAM). So as not to obscure the embodiments, the disclosure is described with reference to MTJ as the resistive element. However, the embodiments can be used for any type of resistive device. In one embodiment, each bit-cell of the memory cells includes an MTJ device coupled in series with a select transistor MN such that the free magnetic layer of the MTJ device is coupled to BL and the fixed magnetic layer of MTJ is coupled to a source/drain terminal of MN. In this embodiment, drain/source terminal of MN is coupled to SL while gate terminal of MN is coupled to WL. In the embodiment of column 200, "N+1" number of bit-cells are shown in a column and one of the bit-cell-i is shown with its structure having MTJi device and MNi transistor, where 'i' is an integer between '0' and 'N.'

In one embodiment, Local Write Drivers (i.e., Local Write Driver 202-1 and 202-M) are distributed evenly throughout column 200. In one embodiment, each of the Local Write Drivers (i.e., Local Write Driver 202-1 and 202-M) comprise a SL driver. In one embodiment, each of the Local Write Drivers (i.e., Local Write Driver 202-1 and 202-M) comprise a BL driver. In one embodiment, each of the Local Write Drivers (i.e., Local Write Driver 202-1 and 202-M) comprise both a BL driver and SL driver. In one embodiment, BL and SL drivers are operable to be enabled by a write enable (WREN) signal. In one embodiment, the Local Write Drivers (i.e., Local Write Driver 202-1 and 202-M) are embedded in column 200 without disrupting the memory cell array layout, thus leading to significant area savings.

In one embodiment, End Driver 203 comprises Vcc write drivers that are located at the end of column 200. In one embodiment, the Vcc write drivers are self-triggered in that they behave as keepers to reduce the series resistance of the BL and/or SL.

Figure 3A:
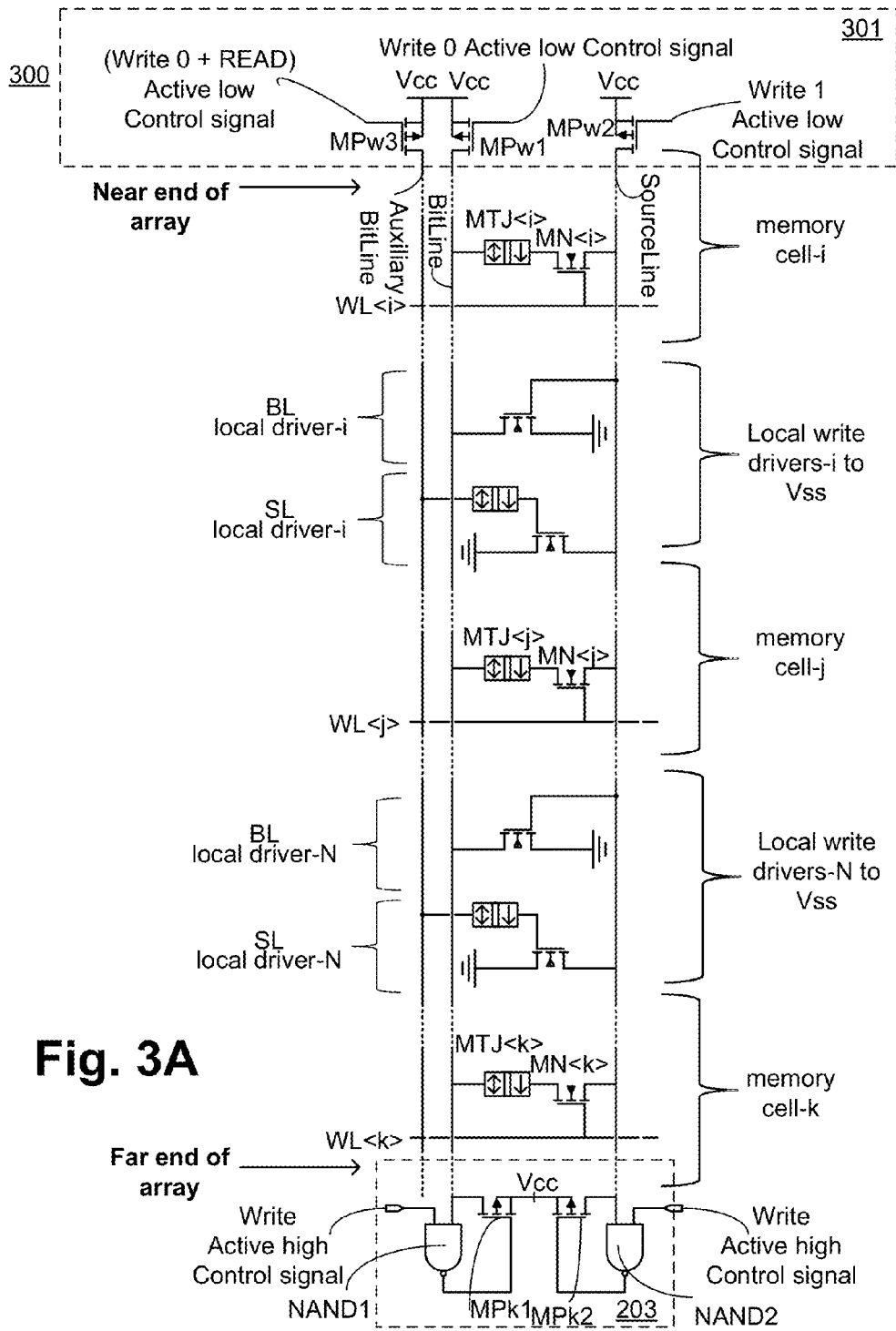
FIG. 3A illustrates a circuit of a column of a memory array with resistive memory cells and with embedded write drivers on an alternate BitLine (BL) and regular BL and/or SourceLine (SL), according to one embodiment of the disclosure.

FIG. 3A illustrates a circuit 300 of a column of a memory array with embedded write drivers on an alternate BL and regular BL and/or SL, according to one embodiment of the disclosure. It is pointed out that those elements of FIG. 3A having the same reference numbers (or names) as the elements of any other figure can operate or function in any manner similar to that described, but are not limited to such.

Circuit 300 shows a column of resistive memory cells in a memory array. Here, the memory cells are indicated by memory cell-i (MTJ<i> coupled to MN<i>), memory cell-j (MTJ<j> coupled to MN<j>), and memory cell-k (MTJ<k> coupled to MN<k>), where 'i,' 'j,' and 'k' are integers such that 'k' is greater than 'j,' and 'j' is greater than 'i.' In one embodiment, each of the select transistors are controllable by a respective WL. For example, MN<i> is controllable by WL<i>, MN<j> is controllable by WL<j>, and MN<k> is controllable by WL<k>.

In one embodiment, circuit 300 includes a first BL (i.e., normal BL), dedicated BL (also called Auxiliary BL or second BL), and SL. In one embodiment, each of the BLs and SL are driven by respective Write Drivers shown in write Driver 301. In one embodiment, each of the resistive memory cells is coupled to the first BL and the SL. For example, source/drain terminal of select transistor of the memory cell is coupled to the SL and the free magnetic layer of the MTJ device is coupled to the first BL.

In one embodiment, Write Driver 301 comprises a first driver having a p-type transistor MPw1 coupled to the first BL such that its drain terminal is coupled to the first BL, its source terminal is coupled to power supply (Vcc), and its gate terminal is controllable by a write control signal. In this embodiment, the write control signal is a Write '0' active low control signal.

In one embodiment, the second driver of Write Driver 301 includes a p-type transistor MPw2 coupled to the SL such that its drain terminal is coupled to the SL, its source terminal is coupled to power supply (Vcc), and its gate terminal is controllable by a write control signal. In this embodiment, the write control signal is a Write '1' active low control signal.

In one embodiment, Write Driver 301 comprises a third driver having a p-type transistor MPw3 coupled to the second BL (i.e., Auxiliary BL) such that its drain terminal is coupled to the second BL, its source terminal is coupled to power supply (Vcc), and its gate terminal is controllable by a write control signal. In this embodiment, the write control signal is an active low control signal (e.g., Write0 OR Read signals). In other embodiments, other types of write drivers may be used that are controllable by appropriate write control signals used for writing a zero (i.e., logical low) or a one (i.e., logical high). In one embodiment, the third driver has a weak strength since it may not need to drive write current to the MTJs. In one embodiment, the third driver is only used for applying a select signal.

In one embodiment, circuit 300 includes an End Driver 203 coupled to the end of the column. In one embodiment, End Driver 203 are Vcc write drivers which are self-triggered in that they behave as keepers to reduce the series resistance of the first BL and/or SL. In one embodiment, End Driver 203 includes a first NAND (NAND1) gate, a first transistor MPk1, a second NAND (NAND2) gate, and a second transistor MPk2.

In one embodiment, first NAND gate has a first input coupled to Write Active High Control signal and a second input coupled to a drain terminal of first transistor MPk1 (i.e., p-type). In one embodiment, Write Active High Control signal is an active high undifferentiated write control signal. In this embodiment, differentiation '0' (and respectively differentiation '1') comes from selected BL (and respectively selected SL). In one embodiment, output of first NAND gate is coupled to the gate terminal of first transistor MPk1. In one embodiment, source terminal of first transistor MPk1 is coupled to power supply (Vcc). In one embodiment, drain terminal of first transistor MPk1 is coupled to first BL.

In one embodiment, second NAND gate has a first input coupled to Write Active High Control signal and a second input coupled to a drain terminal of second transistor MPk2 (i.e., p-type). In one embodiment, Write Active High Control signal is an active high undifferentiated write control signal. In this embodiment, differentiation '0' (and respectively differentiation '1') comes from selected BL (and respectively selected SL). In one embodiment, output of second NAND gate is coupled to the gate terminal of second transistor MPk2. In one embodiment, source terminal of second transistor MPk2 is coupled to power supply (Vcc). In one embodiment, drain terminal of MPk2 is coupled to SL.

In one embodiment, when BL (and respectively SL) is driven for a Write '0' (respectively Write '1') then NAND1 (respectively NAND2) turns on MPk1 (respectively MPk2). In such an embodiment, the latter transistors enhance current drive to the first BL and SL. In one embodiment, End Driver 203 (also referred as the far-end driver) behaves as keeper. In one embodiment, End Driver 203 may be triggered by the near-end drivers to strengthen the write operation at the array far-end. In one embodiment, when a p-type device is used as access device for the memory cell, then BL and SL polarities are opposite to the polarities discussed in various embodiments (which are described with reference to n-type access transistors of memory cells). In such an embodiment, first and second NAND gates may be replaced with first and second NOR gates (not shown).

In one embodiment, SL drivers (i.e., SL driver-i to SL driver-N) are distributed throughout the column of memory cells. In one embodiment, each SL driver comprises an MTJ device coupled to a n-type transistor such that the free magnetic layer of MTJ device is coupled to the second BL and the fixed magnetic layer of MTJ device is coupled to the gate terminal of the n-type transistor.

In one embodiment, to write a logical high to a bit-cell (e.g., memory cell-j), WL<j> is selected which turns on MN<j> (i.e., MN<j> is selected) and first BL is lowered relative to the SL. The MTJ device (i.e., MTJ<j>) of the selected bit-cell writes high-resistance state because the write current flows from the fixed magnetic layer (also called pinned layer) to the free magnetic layer, and then flows to the first BL. High-resistance state is achieved when the magnetic direction of the two magnets is un-aligned relative to one another.

In this embodiment, MPw1 of write driver 301 is turned off and MPw2 of write driver 301 is turned on which couples Vcc to SL. In one embodiment, the distributed local BL write drivers (e.g., BL local driver-i and BL local driver-N) are turned on because the n-type transistors of those drivers are turned on by the high SL. In such an embodiment, the first BL is pulled low by the local BL write drivers.

The pulling low of the first BL through its entire length (i.e., from the start of the column at the Write Driver 301 end to the far end of the array) reduces resistance of the first BL for all memory cells coupled to the first BL. This lower resistance of the first BL improves the process of writing a one to the memory cell. In this embodiment, when writing a logical high to a bit-cell, Auxiliary BL (i.e., second BL) is floating or grounded because third p-type transistor MPw3 of the Write Driver 301 is turned off. In this embodiment, by driving Vss to first BL in a regular and distributed way, write margin is increased. In one embodiment, End Driver 203 causes Vcc to be driven on SL which further strengthens the high level on SL. In this embodiment, output of NAND2 is a logical low which turns on MPk2 which then couples Vcc to SL. During this time, MPk1 is off due to the first BL being low.

In one embodiment, to write a logical low to a bit-cell (e.g., memory cell-j), WL<j> is selected which turns on MN<j> (i.e., MN<j> is selected), and first BL is raised relative to SL. The MTJ device (i.e., MTJ<j>) of the selected bit-cell writes low-resistance state because the write current flows from the free magnetic layer to the fixed magnetic layer (also called pinned layer), and then goes through MN<j> to the SL. Low-resistance state is achieved when the magnetic direction of the two magnets is aligned relative to one another. In this embodiment, SL is set to ground level.

In this embodiment, MPw1 and MPw3 of write driver 301 are turned on, and MPw2 of Write Driver 301 is turned off. In this embodiment, Auxiliary BL and first BL are pulled high. In this embodiment, local SL drivers (e.g., SL local driver-i and SL local driver-N) are turned on because the free magnetic layers of the respective MTJ devices of the local SL drivers is coupled to Vcc which causes the n-type transistors coupled to the MTJ devices to turn on thus causing SL to be pulled low. In this embodiment, by driving Vcc to first and second BLs and Vss on SL, write margin is increased. One reason for improving write margin is that parasitic series resistance is mitigated. In one embodiment, End Driver 203 causes Vcc to be driven on the first BL which further strengthens the high level on the first BL. In this embodiment, output of NAND1 is a logical low which turns on MPk1 which then couples Vcc to the first BL. During this time, MPk2 is off.

To read from a bit-cell (e.g., memory cell-j), WL<j> is selected which turns on MN<j> (i.e., MN<j> is selected), SL is set to logical low and first and second BLs are raised relative to SL and MTJ device resistance is sensed using weak current (e.g., $1/8^{th}$ of write current). In this embodiment, MPw3 of Write Driver 301 is turned on which drive a high to the second BL. In this embodiment, MPw2 of Write Driver 301 is off. In one embodiment, high second BL turns on the n-type transistors of the SL local drivers which cause the SL to couple to ground by the SL local drivers. By driving Vss on SL during read operation, resistance of SL is reduced and read margin is increased. In one embodiment, during read operation, End Driver 203 is disabled so as not to interfere with the read operation.

While the embodiments are described with a resistive memory cell having a transistor (e.g., MN<i>) with a source terminal coupled to the SL, and a gate terminal coupled to a WL; and a resistive element (e.g., MTJ<i>) with one end coupled to the first BL, and another end coupled to the drain terminal of the transistor, the resistive element can be coupled to a diode. For example, in one embodiment, the transistor is diode connected such that the drain terminal of the transistor is coupled to the gate terminal of the transistor. In such an embodiment, WL is not connected to the gate terminal of the transistor. In one embodiment, the transistor is replaced with a two-terminal diode (e.g., parasitic or actual diode). In such an embodiment, WL is not connected to the two-terminal diode of the transistor.

Figure 3B:
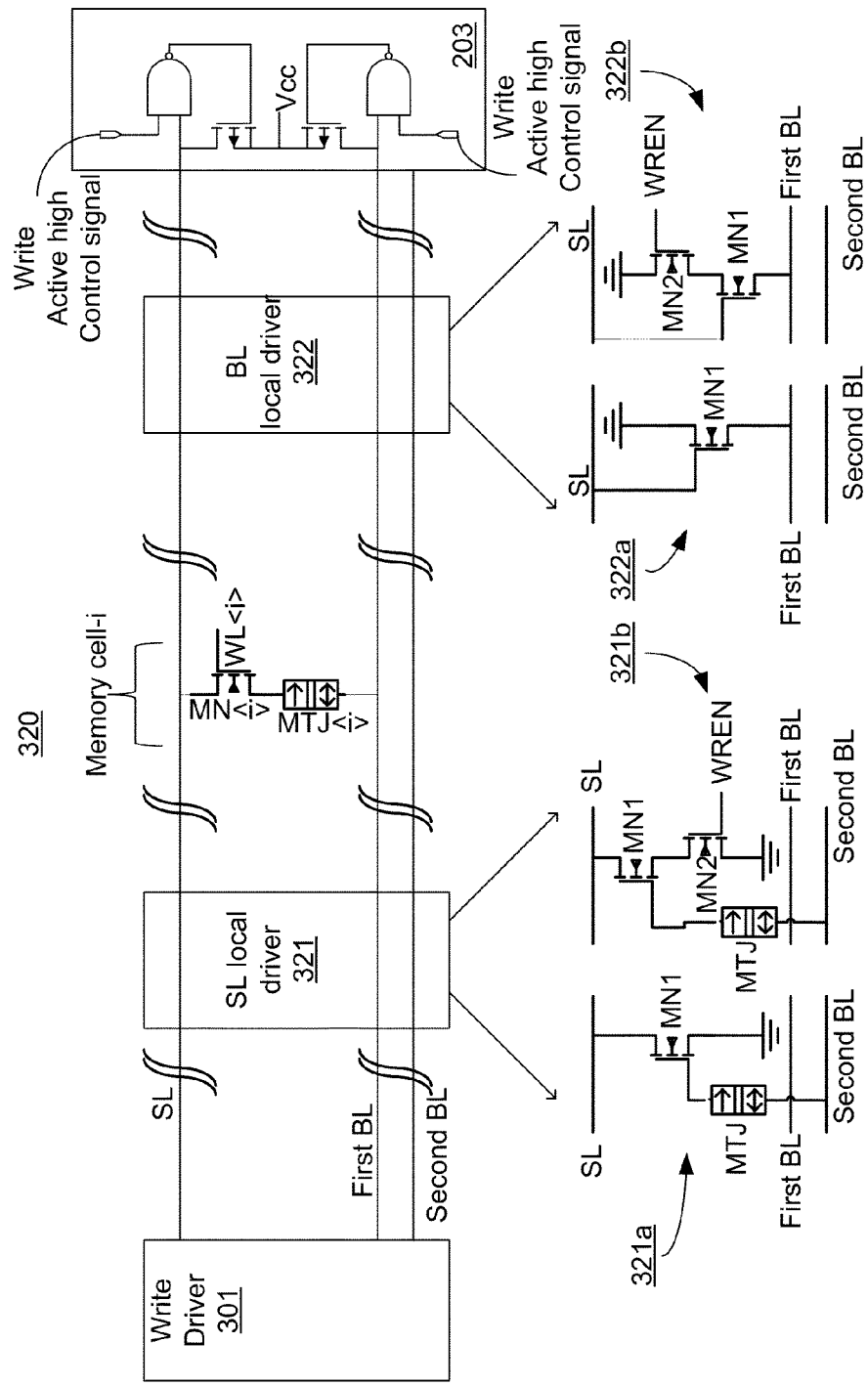
FIG. 3B illustrates a circuit of a column of a memory array with resistive memory cells and with various designs of write drivers on an alternate BL and regular BL and/or SL, according to one embodiment of the disclosure.

FIG. 3B illustrates a circuit 320 of a column of a memory array with various designs of write drivers on an alternate BL and/or regular BL and/or SL, according to one embodiment of the disclosure. It is pointed out that those elements of FIG. 3B having the same reference numbers (or names) as the elements of any other figure can operate or function in any manner similar to that described, but are not limited to such.

In this embodiment, alternative designs for SL local driver 321 and BL local driver 322 are described. In one embodiment, SL local driver 321 may comprise driver 321a or driver 321b. In one embodiment, driver 321a is similar to the SL driver discussed with reference to FIG. 3A. Referring back to FIG. 3B, in one embodiment, driver 321a comprises an n-type transistor MN1 and an MTJ device. In one embodiment, drain terminal of MN1 is coupled to SL and source terminal of MN1 is coupled to ground, and gate terminal of MN1 is coupled to fixed layer of the MTJ device. In one embodiment, free magnetic layer of MTJ device is coupled to the second BL (also referred to as the Auxiliary BL). In one embodiment, MN1 of 321a can be replaced with a p-type device (not shown) with a drain terminal coupled to SL and source terminal coupled to power supply, and gate terminal coupled to MTJ.

In one embodiment, driver 321b comprises a first n-type transistor MN1, a second n-type transistor MN2, and an MTJ device. In one embodiment, drain terminal of MN1 is coupled to SL and source terminal of MN1 is coupled to drain terminal of MN2, and gate terminal of MN1 is coupled to fixed layer of the MTJ device. In one embodiment, free magnetic layer of MTJ device is coupled to the second BL (also referred to as the Auxiliary BL). In one embodiment, source terminal of MN2 is coupled to ground, and gate terminal of MN2 is coupled to write enable signal (WREN). In this embodiment, SL driver 321b is enabled during write only i.e., when WREN is logically high.

In one embodiment, BL local driver 322 comprises driver 322a or driver 322b. In one embodiment, driver 322a is similar to the BL driver discussed with reference to FIG. 3A. Referring back to FIG. 3B, in one embodiment, driver 322a includes an n-type transistor MN1 with its source terminal coupled to ground, drain terminal coupled to the first BL, and gate terminal coupled to SL. In one embodiment, driver 322b comprises a first n-type transistor MN1 and a second n-type transistor MN2 coupled in series with MN1. In this embodiment, drain terminal of MN1 is coupled to the first BL, source terminal of MN1 if coupled to drain terminal of MN2, and gate terminal of MN1 is coupled to SL. In one embodiment, gate terminal of MN2 is coupled to WREN and source terminal of MN2 is coupled to ground. In this embodiment, BL driver 322b is enabled during write only i.e., when WREN is logically high.

In one embodiment, MN1 of 322a can be replaced with a p-type device (not shown) with a drain terminal coupled to the first BL and source terminal coupled to power supply, and gate terminal coupled to SL.

Figure 4A:
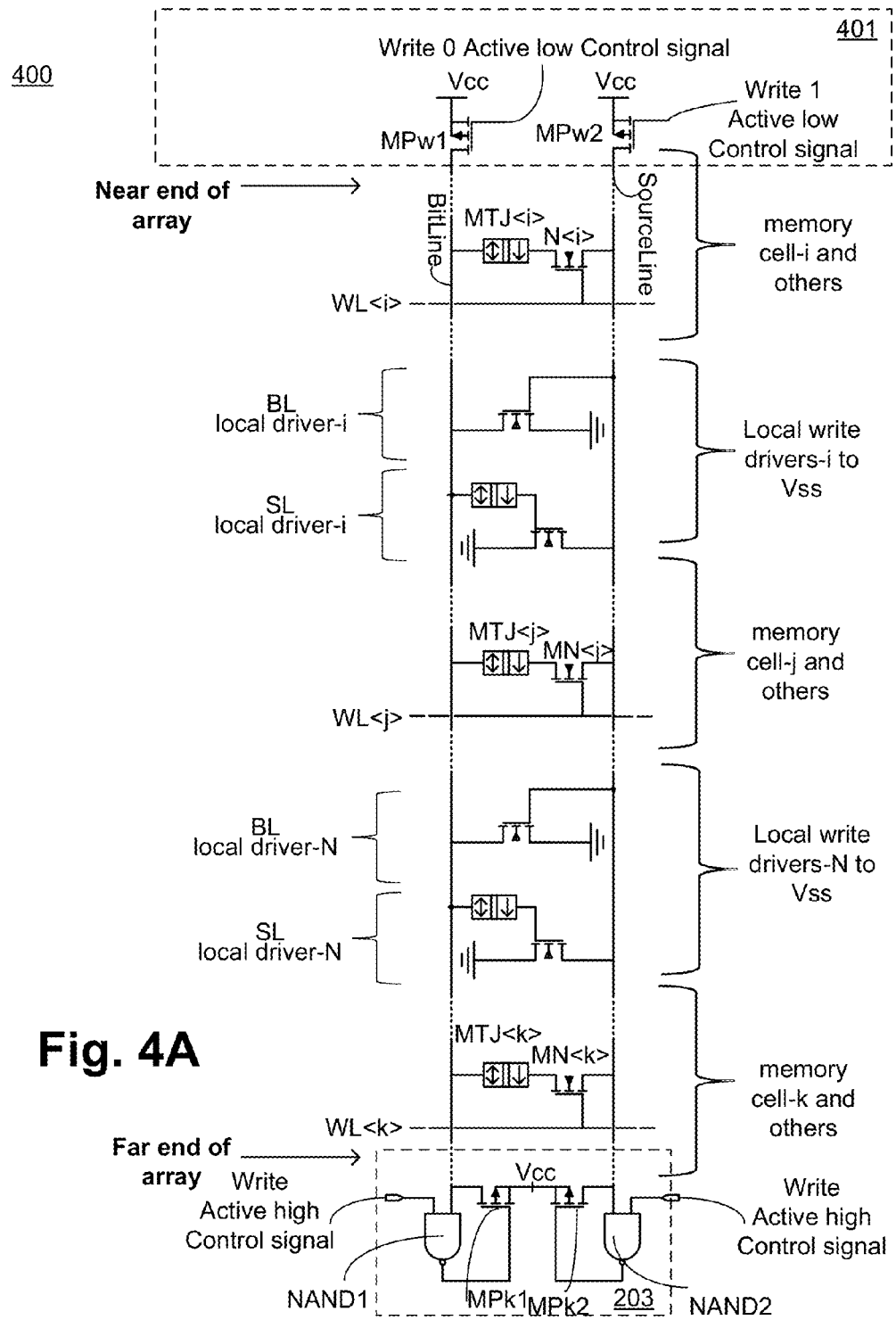
FIG. 4A illustrates a circuit of a column of a memory array with embedded write drivers on a regular BL and/or SL, according to one embodiment of the disclosure.

FIG. 4A illustrates a circuit 400 of a column of a memory array with embedded write drivers on a regular BL and/or SL, according to one embodiment of the disclosure. It is pointed out that those elements of FIG. 4A having the same reference numbers (or names) as the elements of any other figure can operate or function in any manner similar to that described, but are not limited to such. FIG. 4A is described with reference to FIG. 3A. So as not to obscure the embodiments, differences between FIG. 4A and FIG. 3A are discussed.

In this embodiment, Auxiliary BL is removed and free magnetic layers of the SL drivers (SL local driver-i to SL local driver-N) are coupled to BL. In this embodiment, write driver 401 does not include MPw3 for driving the Auxiliary BL.

In one embodiment, to write a logical high to a bit-cell (e.g., memory cell-j), WL<j> is selected which turns on MN<j> (i.e., MN<j> is selected) and BL is lowered relative to the SL. The MTJ device (i.e., MTJ<j>) of the selected bit-cell writes high-resistance state because the write current flows from the fixed magnetic layer (also called pinned layer) to the free magnetic layer, and then flows to BL. High-resistance state is achieved when the magnetic direction of the two magnets is un-aligned relative to one another.

In this embodiment, MPw1 of write driver 401 is turned off and MPw2 of write driver 401 is turned on which couples Vcc to SL. In one embodiment, the distributed local BL write drivers (e.g., BL local driver-i and BL local driver-N) are turned on because the n-type transistors of those drivers are turned on by the high SL. In such an embodiment, BL is pulled low by the local BL write drivers.

The pulling low of BL through its entire length (i.e., from the start of the column at the write driver 401 end to the far end of the array) reduces resistance of BL for all memory cells coupled to BL. This lower resistance of BL improves the process of writing a one to the memory cell. In one embodiment, End Driver 203 causes Vcc to be driven on SL which further strengthens the high level on SL. In this embodiment, output of NAND2 is a logical low which turns on MPk2 which then couples Vcc to SL. During this time, MPk1 is off. In this embodiment, by driving Vss to BL, write margin is increased.

In one embodiment, to write a logical low to a bit-cell (e.g., memory cell-j), WL<j> is selected which turns on MN<j> (i.e., MN<j> is selected), and BL is raised relative to SL. The MTJ device (i.e., MTJ<j>) of the selected bit-cell writes low-resistance state because the write current flows from the free magnetic layer to the fixed magnetic layer (also called pinned layer), and then goes through MN<j> to the SL. Low-resistance state is achieved when the magnetic direction of the two magnets is aligned relative to one another. In this embodiment, SL is set to ground level.

In this embodiment, MPw1 of write driver 401 is turned on, and MPw2 of write driver 401 is turned off. In this embodiment, BL is pulled high. In this embodiment, local SL drivers (e.g., SL local driver-i and SL local driver-N) are turned on because the free magnetic layers of the respective MTJ devices of the local SL drivers are coupled to Vcc which causes the n-type transistors coupled to the MTJ devices to turn on thus causing SL to be pulled low. In one embodiment, End Driver 203 causes Vcc to be driven on BL which further strengthens the high level on BL. In this embodiment, output of NAND1 is a logical low which turns on MPk1 which then couples Vcc to BL. During this time, MPk2 is off. In this embodiment, by driving Vcc to BL and Vss on SL, write margin is increased.

To read from a bit-cell (e.g., memory cell-j), WL<j> is selected which turns on MN<j> (i.e., MN<j> is selected), SL is set to logical low and BL is raised relative to SL and MTJ device resistance is sensed using weak current (e.g., $\frac{1}{8}^{th}$ of write current). In one embodiment, BL is raised to Vread voltage. Typically, Vread is not high enough (~100 mV) to reliably turn on SL local drivers. In one embodiment, WREN gating signal is used for reading. In such an embodiment, SL is grounded by other means not shown here.

While the embodiments are described with a resistive memory cell having a transistor (e.g., MN<i>) with a source terminal coupled to the SL, and a gate terminal coupled to a WL; and a resistive element (e.g., MTJ<i>) with one end coupled to the BL, and another end coupled to the drain terminal of the transistor, the resistive element can be coupled to a diode. For example, in one embodiment, the transistor is diode connected such that the drain terminal of the transistor is coupled to the gate terminal of the transistor. In such an embodiment, WL is not connected to the gate terminal of the transistor. In one embodiment, the transistor is replaced with a two-terminal diode (e.g., parasitic or actual diode). In such an embodiment, WL is not connected to the two-terminal diode of the transistor.

Figure 4B:
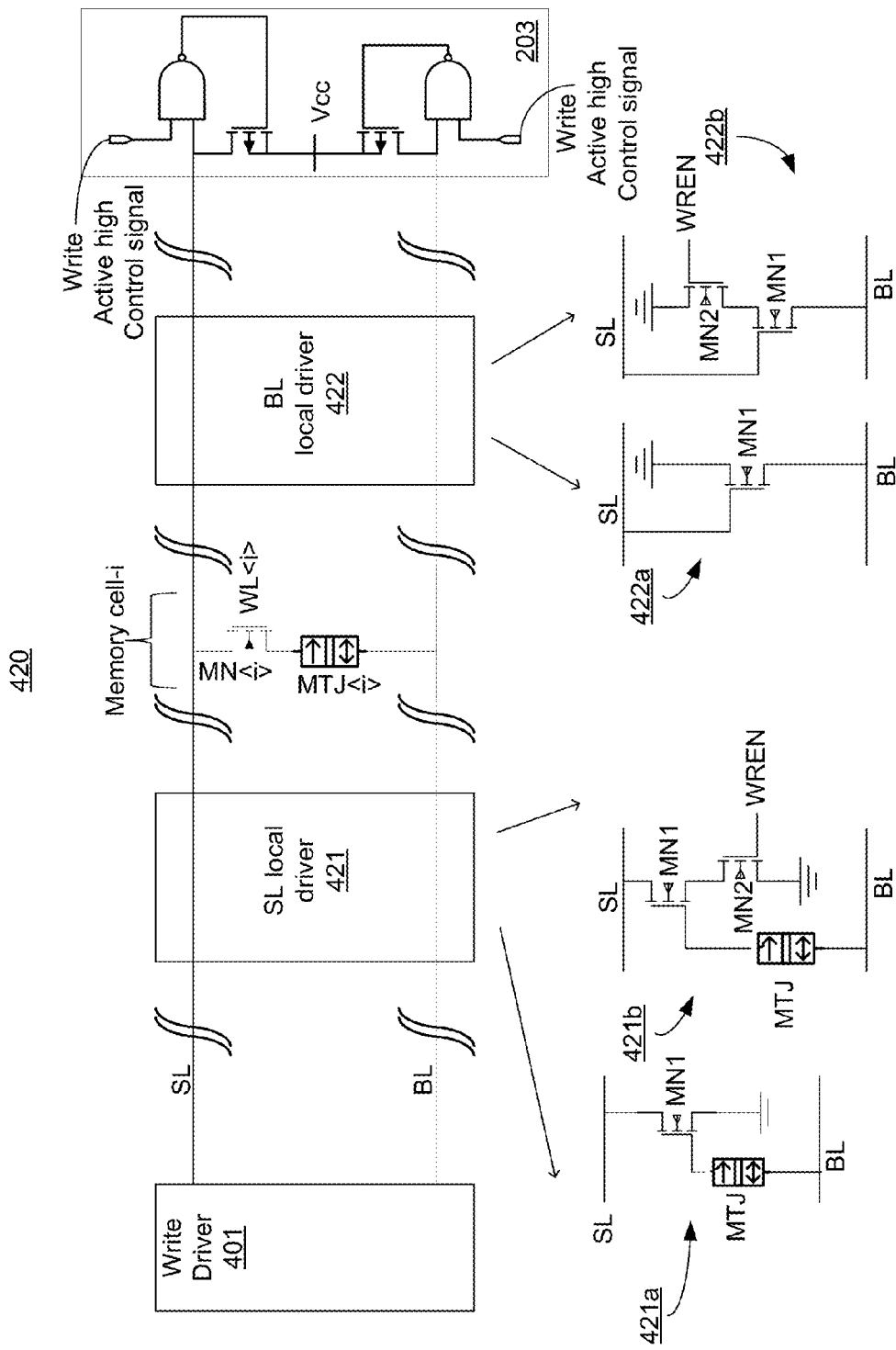
FIG. 4B illustrates a circuit of a column of a memory array with resistive memory cells and with various designs of write drivers on a regular BL and/or SL, according to one embodiment of the disclosure.

FIG. 4B illustrates a circuit 420 of a column of a memory array with various designs of write drivers on a regular BL and/or SL, according to one embodiment of the disclosure. It is pointed out that those elements of FIG. 4B having the same reference numbers (or names) as the elements of any other figure can operate or function in any manner similar to that described, but are not limited to such.

In this embodiment, alternative designs for SL local driver 421 and BL local driver 422 are described. In one embodiment, SL local driver 421 may comprise driver 421a or driver 421b. In one embodiment, driver 421a is similar to the SL driver discussed with reference to FIG. 4A. Referring back to FIG. 4B, in one embodiment, driver 421a comprises an n-type transistor MN1 and an MTJ device. In one embodiment, drain terminal of MN1 is coupled to SL and source terminal of MN1 is coupled to ground, and gate terminal of MN1 is coupled to fixed layer of the MTJ device. In one embodiment, free magnetic layer of MTJ device is coupled to BL. In one embodiment, MN1 of 421a can be replaced with a p-type device (not shown) with a drain terminal coupled to SL and source terminal coupled to power supply, and gate terminal coupled to MTJ.

In one embodiment, driver 421b comprises a first n-type transistor MN1, a second n-type transistor MN2, and an MTJ device. In one embodiment, drain terminal of MN1 is coupled to SL and source terminal of MN1 is coupled to drain terminal of MN2, and gate terminal of MN1 is coupled to fixed layer of the MTJ device. In one embodiment, free magnetic layer of MTJ device is coupled to BL. In one embodiment, source terminal of MN2 is coupled to ground, and gate terminal of MN2 is coupled to write enable signal (WREN). In this embodiment, SL driver 421b is enabled during write only i.e., when WREN is logically high.

In one embodiment, BL local driver 422 comprises driver 422a or driver 422b. In one embodiment, driver 422a is similar to the BL driver discussed with reference to FIG. 4A.

Referring back to FIG. 4B, in one embodiment, driver 422a includes an n-type transistor MN1 with its source terminal coupled to ground, drain terminal coupled to BL, and gate terminal coupled to SL. In one embodiment, driver 422b comprises a first n-type transistor MN1 and a second n-type transistor MN2 coupled in series with MN1. In this embodiment, drain terminal of MN1 is coupled to BL, source terminal of MN1 is coupled to drain terminal of MN2, and gate terminal of MN1 is coupled to SL. In one embodiment, gate terminal of MN2 is coupled to WREN and source terminal of MN2 is coupled to ground. In this embodiment, BL driver 422b is enabled during write only i.e., when WREN is logically high.

In one embodiment, MN1 of 422a can be replaced with a p-type device (not shown) with a drain terminal coupled to BL and source terminal coupled to power supply, and gate terminal coupled to SL.

Figure 5:
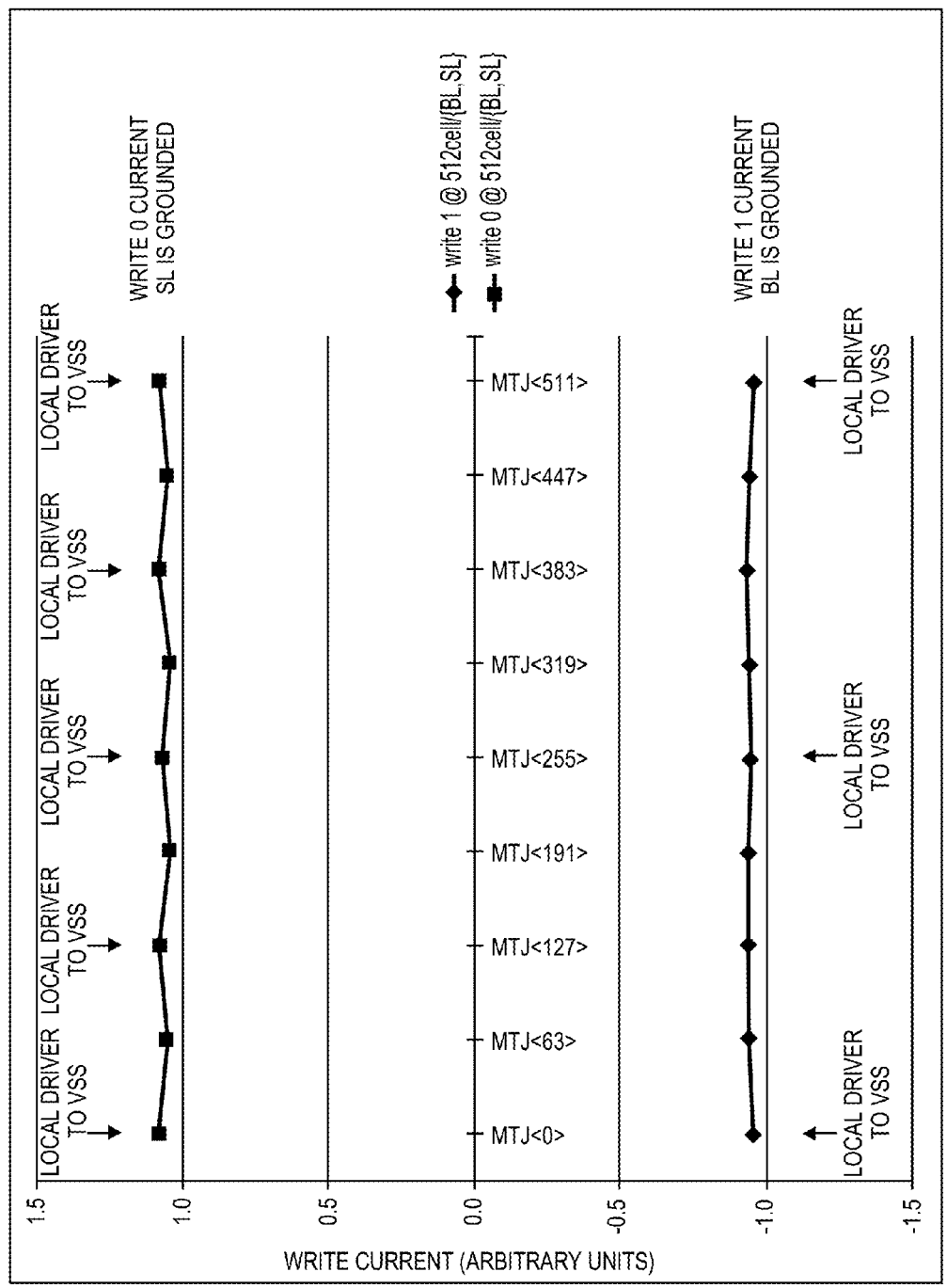
FIG. 5 illustrates a plot with normalized data showing improved write current for all memory cells in a column using the discussed embodiments.

FIG. 5 illustrates a plot 500 with normalized data showing improved write current for all memory cells in a column using the discussed embodiments. It is pointed out that those elements of FIG. 5 having the same reference numbers (or names) as the elements of any other figure can operate or function in any manner similar to that described, but are not limited to such.

Here, x-axis is a column of memory cells from bit-cell 0 to 511, and the y-axis is write current (normalized). Plot 500 includes two sets of data. The first set of data is on the top which shows a nearly constant write zero current when SL is grounded. The embodiments allow SL to be grounded (to Vss) using the distributed SL local drivers along the column of memory cells. The second set of data is on the bottom which shows a nearly constant write one current when BL is grounded. The embodiments allow BL to be grounded (to Vss) using the distributed BL local drivers along the column of memory cells. BL and SL series resistances may be asymmetric. For example, series resistance of SL may be greater than series resistance of BL. In one such embodiment, more SL local drivers are added than their BL counterparts to account for higher SL series resistance. In one embodiment, where BL has higher series resistance than SL, more BL local drivers may be added than SL counterparts to account for higher BL series resistance.

Figure 6:
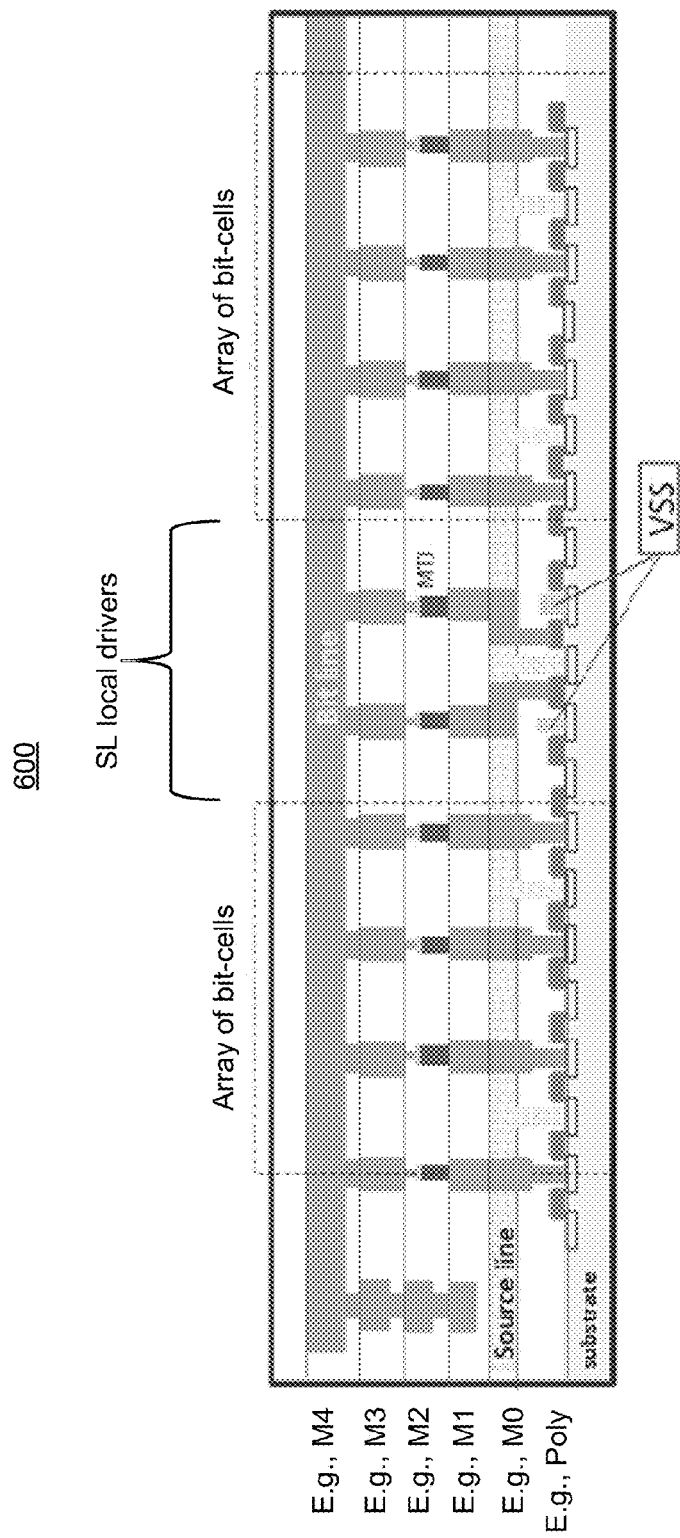
FIG. 6 illustrates a cross-section of a layout with embedded MTJ (magnetic tunnel junction) based write driver, according to one embodiment of the disclosure.

FIG. 6 illustrates a cross-section 600 of a layout with embedded MTJ (magnetic tunnel junction) based write driver, according to one embodiment of the disclosure. It is pointed out that those elements of FIG. 6 having the same reference numbers (or names) as the elements of any other figure can operate or function in any manner similar to that described, but are not limited to such.

The cross section shows process layers—substrate, poly, metal zero (M0), metal one (M1), metal two (M2), metal three (M3), and metal four (M4). In this embodiment, SL is on M0 and BL is on M4. M4 being a higher metal has lower resistivity than M0. In this embodiment, MTJs for the bit cell and the SL local driver is formed in the region between M1 and M3.

In one embodiment, SL local drivers are embedded in the array of bit-cells without disruption of the memory array i.e., BL and SL are not disrupted. In this embodiment, actual MTJs instead of vias are used to convey BL select signals to the SL local write drivers. One technical effect of such an embodiment is that there is no need to disrupt the array of MTJs resulting in a more compact layout than traditional layouts. If vias are used instead of MTJs, large gaps between neighboring bit-cells may be formed causing the overall layout to expand instead of compacting.

Figure 7:
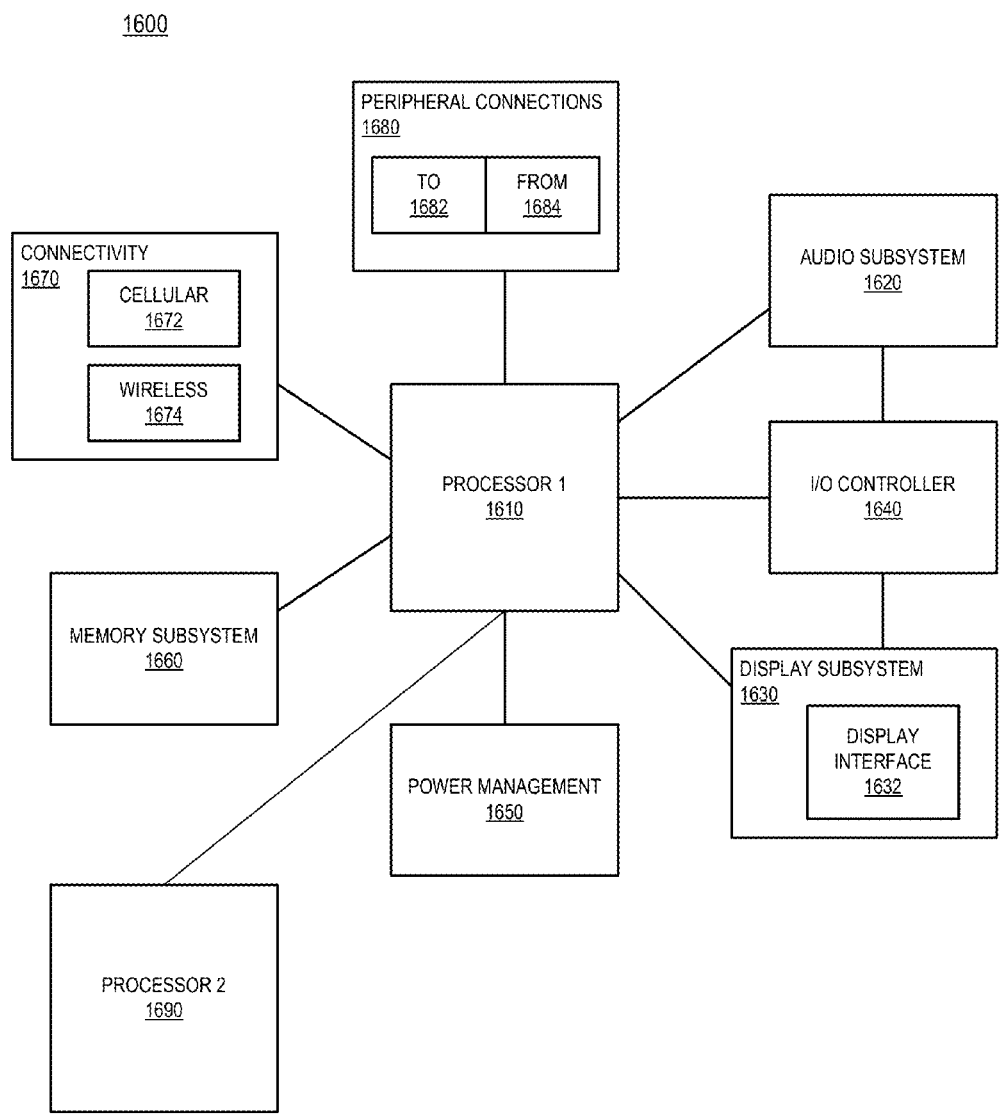
FIG. 7 is a smart device or a computer system or an SoC (System-on-Chip) with a memory array with write drivers on BL and SL, according to one embodiment of the disclosure.

FIG. 7 is a smart device or a computer system or an SoC (System-on-Chip) 1600 with a memory array with embedded drivers on the BL(s) and/or SL signal path, according to one embodiment of the disclosure. It is pointed out that those elements of FIG. 7 having the same reference numbers (or names) as the elements of any other figure can operate or function in any manner similar to that described, but are not limited to such.

FIG. 7 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with a memory array with embedded drivers on the BL(s) and SL signal path, according to the embodiments discussed. Other blocks of the computing device 1600 may also include a memory array with embedded drivers on the BL(s) and SL signal path as discussed on various embodiments. The various embodiments of the present disclosure may also comprise a network interface within 1670 such as a wireless interface so that a system embodiment may be incorporated into a wireless device, for example, cell phone or personal digital assistant.

In one embodiment, processor 1610 (and/or processor 1690) can include one or more physical devices, such as microprocessors, application processors, microcontrollers, programmable logic devices, or other processing means. In one embodiment, process 1690 is optional. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a sourceline; a first bitline; a column of resistive memory cells, each resistive memory cell of the column coupled at one end to the sourceline and coupled to the first bitline at another end; and a second bitline in parallel to the first bitline, the second bitline to decouple read and write operations on the bitline for the resistive memory cell. In one embodiment, the apparatus further comprises: sourceline write drivers coupled to the second bitline, wherein the sourceline write drivers are distributed along the column of resistive memory cells.

In one embodiment, each of the sourceline write drivers comprises: a transistor coupled to the sourceline and ground or power supply; and a resistive element with one end coupled to the second bitline, and another end coupled to a gate terminal of the transistor. In one embodiment, each of the sourceline write drivers comprises: a first transistor coupled to the sourceline and another node; a second transistor coupled to the other node and ground or power supply, the second transistor controllable by write enable; and a resistive element with one end coupled to the second bitline, and another end coupled to a gate terminal of the first transistor.

In one embodiment, the resistive element is at least one of: magnetic tunnel junction (MTJ) device; phase change memory (PCM) device; resistive ram (ReRAM); conductive bridging ram (CBRAM). In one embodiment, the transistor is an n-type transistor. In one embodiment, the apparatus further comprises: bitline write drivers coupled to the first bitline, wherein the bitline write drivers are distributed along the column of resistive memory cells. In one embodiment, each of the bitline write drivers comprises a transistor coupled to the first bitline and ground or power supply such that a gate terminal of the transistor is coupled to the sourceline. In one embodiment, each of the bitline write drivers comprises: a first transistor coupled to the bitline and another node, wherein a gate terminal of the first transistor is coupled to the sourceline; and a second transistor coupled to the other node and ground or power supply, wherein a gate terminal of the second transistor is controllable by write enable.

In one embodiment, each of the resistive memory cells includes: a transistor with a source terminal coupled to the sourceline, and a gate terminal coupled to a wordline or a drain terminal of the transistor; and a resistive element with one end coupled to the first bitline, and another end coupled to the drain terminal of the transistor. In one embodiment, the resistive element is at least one of: magnetic tunnel junction (MTJ) device; phase change memory (PCM) device; resistive ram (ReRAM); conductive bridging ram (CBRAM). In one embodiment, the transistor is an n-type transistor.

In one embodiment, the apparatus further comprises: a pair of write drivers at an end of a column of memory cells, the pair of drivers coupled to the first bitline and the sourceline. In one embodiment, the pair of write drivers comprises: a first NAND gate having a first input coupled to a write control signal, and a second input coupled to the first bitline; and a first transistor with a source terminal coupled to a power supply node, a drain terminal coupled to the first bitline and second input of the first NAND gate, and a gate terminal controllable by an output of the first NAND gate.

In one embodiment, the pair of write drivers is far-end drivers and behaves as keepers. In one embodiment, the pair of write drivers may be triggered by the near-end drivers to strengthen the write operation at the array far-end. In one embodiment, when a p-type device is used as access device for the memory cell, then BL and SL polarities are opposite to the polarities discussed in various embodiments (which are described with reference to n-type access transistors of memory cells). In such an embodiment, first and second NAND gates may be replaced with first and second NOR gates.

In one embodiment, the pair of write drivers further comprises: a second NAND gate having a first input coupled to the write control signal, and a second input coupled to the sourceline; and a second transistor with a source terminal coupled to the power supply node, a drain terminal coupled to the sourceline and second input of the second NAND gate, and a gate terminal controllable by an output of the second NAND gate. In one embodiment, the first and second transistors are p-type transistors.

In another example, an apparatus is provided which comprises: a sourceline; a bitline; a column of resistive memory cells, each resistive memory cell in the column coupled at one end to the sourceline and coupled to the bitline at another end; and sourceline write drivers coupled to the bitline and the sourceline, wherein the sourceline write drivers are distributed along the column of resistive memory cells. In one embodiment, each of the sourceline write drivers comprises: a transistor coupled to the sourceline and ground or power supply; and a resistive element with one end coupled to the bitline, and another end coupled to a gate terminal of the transistor.

In one embodiment, each of the sourceline write drivers comprises: a first transistor coupled to the sourceline and another node; a second transistor coupled to the other node and ground or power supply, the second transistor controllable by write enable; and a resistive element with one end coupled to the bitline, and another end coupled to a gate terminal of the first transistor. In one embodiment, the apparatus further comprises: bitline write drivers coupled to the bitline, wherein the bitline write drivers are distributed along the column of resistive memory cells.

In one embodiment, each of the bitline write drivers comprises a transistor coupled to the bitline and ground such that a gate terminal of the transistor is coupled to the sourceline. In one embodiment, each of the bitline write drivers comprises: a first transistor coupled to the bitline and another node, wherein a gate terminal of the first transistor is coupled to the sourceline; and a second transistor coupled to the other node and ground, wherein a gate terminal of the second transistor is controllable by write enable.

In one embodiment, each of the resistive memory cell includes: a transistor with a source terminal coupled to the sourceline, and a gate terminal coupled to a wordline; and a resistive element with one end coupled to the first bitline, and another end coupled to a drain terminal of the transistor.

In another example, an apparatus is provided which comprises: a sourceline; a bitline; a column of resistive memory cells, each resistive memory cell in the column coupled at one end to the sourceline and coupled to the bitline at another end; and bitline write drivers coupled to the bitline and the sourceline, wherein the bitline write drivers are distributed along the column of resistive memory cells. In one embodiment, each of the bitline write drivers comprises a transistor coupled to the bitline and ground such that a gate terminal of the transistor is coupled to the sourceline.

In one embodiment, each of the bitline write drivers comprises: a first transistor coupled to the bitline and another node, wherein a gate terminal of the first transistor is coupled to the sourceline; and a second transistor coupled to the other node and ground or power supply, wherein a gate terminal of the second transistor is controllable by write enable. In one embodiment, the apparatus further comprises: sourceline write drivers coupled to the bitline, wherein the sourceline write drivers are distributed along the column of resistive memory cells.

In one embodiment, each of the sourceline write drivers comprises: a transistor coupled to the sourceline and ground; and a resistive element with one end coupled to the bitline, and another end coupled to a gate terminal of the transistor. In one embodiment, wherein each of the sourceline write drivers comprises: a first transistor coupled to the sourceline and another node; a second transistor coupled to the other node and ground, the second transistor controllable by write enable; and a resistive element with one end coupled to the bitline, and another end coupled to a gate terminal of the first transistor.

In another example, a system is provided which comprises: a processor; a memory coupled to the processor, the memory according to the apparatus discussed here; and a wireless interface for allowing the processor to communicate with another device.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a sourceline;
   a first bitline;
   a column of resistive memory cells, each resistive memory cell of the column coupled at one end to the sourceline and coupled to the first bitline at another end;
   a second bitline in parallel to the first bitline, the second bitline to decouple read and write operations on the first bitline for the resistive memory cell; and
   sourceline write drivers coupled to the second bitline, wherein the sourceline write drivers are distributed along the column of resistive memory cells and in between at least a portion of the resistive memory cells in the column, wherein each of the sourceline write drivers comprises
   a transistor coupled to the sourceline and ground or power supply; and
   a resistive element with one end coupled to the second bitline, and another end coupled to a gate terminal of the transistor.

2. The apparatus of claim 1, wherein the resistive element is at least one of:
   magnetic tunnel junction (MTJ) device;
   phase change memory (PCM) device;
   resistive ram (ReRAM); or
   conductive bridging ram (CBRAM).

3. The apparatus of claim 1, wherein the transistor is an n-type transistor.

4. The apparatus of claim 1 further comprises:
   bitline write drivers coupled to the first bitline, wherein the bitline write drivers are distributed along the column of resistive memory cells and in between at least a portion of the resistive memory cells in the column.

5. The apparatus of claim 4, wherein each of the bitline write drivers comprises a transistor coupled to the first bitline and ground or power supply such that a gate terminal of the transistor is coupled to the sourceline.

6. The apparatus of claim 4, wherein each of the bitline write drivers comprises:
   a first transistor coupled to the bitline and another node, wherein a gate terminal of the first transistor is coupled to the sourceline; and
   a second transistor coupled to the other node and ground or power supply, wherein a gate terminal of the second transistor is controllable by write enable.

7. The apparatus of claim 1, wherein each of the resistive memory cells includes:
   a transistor with a source terminal coupled to the sourceline, and a gate terminal coupled to a wordline or a drain terminal of the transistor; and
   a resistive element with one end coupled to the first bitline, and another end coupled to the drain terminal of the transistor.

8. The apparatus of claim 1 further comprises:
   a pair of write drivers at an end of a column of memory cells, the pair of drivers coupled to the first bitline and the sourceline.

9. The apparatus of claim 8, wherein the pair of write drivers comprises:
   a first NAND gate having a first input coupled to a write control signal, and a second input coupled to the first bitline; and
   a first transistor with a source terminal coupled to a power supply node, a drain terminal coupled to the first bitline and second input of the first NAND gate, and a gate terminal controllable by an output of the first NAND gate.

10. The apparatus of claim 9, wherein the pair of write drivers further comprises:
    a second NAND gate having a first input coupled to the write control signal, and a second input coupled to the sourceline; and
    a second transistor with a source terminal coupled to the power supply node, a drain terminal coupled to the sourceline and second input of the second NAND gate, and a gate terminal controllable by an output of the second NAND gate.

11. An apparatus comprising:
    a sourceline;
    a first bitline;

a column of resistive memory cells, each resistive memory cell of the column coupled at one end to the sourceline and coupled to the first bitline at another end;

a second bitline in parallel to the first bitline, the second bitline to decouple read and write operations on the first bitline for the resistive memory cell; and sourceline write drivers coupled to the second bitline, wherein the sourceline write drivers are distributed along the column of resistive memory cells and in between at least a portion of the resistive memory cells in the column, wherein each of the sourceline write drivers comprises:

a first transistor coupled to the sourceline and another node;

a second transistor coupled to the other node and ground or power supply, the second transistor controllable by write enable; and a resistive element with one end coupled to the second bitline, and another end coupled to a gate terminal of the first transistor.

12. An apparatus comprising:

a sourceline;

a bitline;

a column of resistive memory cells, each resistive memory cell in the column coupled at one end to the sourceline and coupled to the bitline at another end; and sourceline write drivers coupled to the bitline and the sourceline, wherein the sourceline write drivers are distributed along the column of resistive memory cells and in between at least a portion of the resistive memory cells in the column, wherein each of the sourceline write drivers comprises:

a transistor coupled to the sourceline and ground or power supply; and a resistive element with one end coupled to the bitline, and another end coupled to a gate terminal of the transistor.

13. The apparatus of claim 12 further comprises:

bitline write drivers coupled to the bitline, wherein the bitline write drivers are distributed along the column of resistive memory cells and in between at least a portion of the resistive memory cells in the column.

14. The apparatus of claim 13, wherein each of the bitline write drivers comprises a transistor coupled to the bitline and ground or power supply such that a gate terminal of the transistor is coupled to the sourceline.

15. The apparatus of claim 13, wherein each of the bitline write drivers comprises:

a first transistor coupled to the bitline and another node, wherein a gate terminal of the first transistor is coupled to the sourceline; and a second transistor coupled to the other node and ground or power supply, wherein a gate terminal of the second transistor is controllable by write enable.

16. The apparatus of claim 12, wherein each of the resistive memory cell includes:

a transistor with a source terminal coupled to the sourceline, and a gate terminal coupled to a wordline; and a resistive element with one end coupled to the first bitline, and another end coupled to a drain terminal of the transistor.

17. An apparatus comprising:

a sourceline;

a bitline;

a column of resistive memory cells, each resistive memory cell in the column coupled at one end to the sourceline and coupled to the bitline at another end; and sourceline write drivers coupled to the bitline and the sourceline, wherein the sourceline write drivers are distributed along the column of resistive memory cells and in between at least a portion of the resistive memory cells in the column, wherein each of the sourceline write drivers comprises:

a first transistor coupled to the sourceline and another node;

a second transistor coupled to the other node and ground or power supply, the second transistor controllable by write enable; and a resistive element with one end coupled to the bitline, and another end coupled to a gate terminal of the first transistor.

18. A system comprising:

a processor;

a memory coupled to the processor, the memory including:

a sourceline;

a first bitline;

a column of resistive memory cells, each resistive memory cell of the column coupled at one end to the sourceline and coupled to the first bitline at another end; and a second bitline in parallel to the first bitline, the second bitline to decouple read and write operations on the bitline for the resistive memory cell;

a wireless interface for allowing the processor to communicate with another device; and sourceline write drivers coupled to the second bitline, wherein the sourceline write drivers are distributed along the column of resistive memory cells and in between at least a portion of the resistive memory cells in the column, wherein each of the sourceline write drivers comprises a transistor coupled to the sourceline and ground or power supply; and a resistive element with one end coupled to the second bitline, and another end coupled to a gate terminal of the transistor.

19. The system of claim 18 further comprises a display unit.

* * * * *